United States Patent
Trotti et al.

(10) Patent No.: US 11,763,884 B2
(45) Date of Patent: Sep. 19, 2023

(54) ENERGY RECOVERY IN FILAMENTARY RESISTIVE MEMORIES

(71) Applicant: Commissariat à l'Énergie Atomique et aux Énergies Alternatives, Paris (FR)

(72) Inventors: Paola Trotti, Grenoble (FR); Gabriel Molas, Grenoble (FR); Sami Oukassi, Grenoble (FR); Gaël Pillonnet, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 17/108,737

(22) Filed: Dec. 1, 2020

(65) Prior Publication Data

US 2021/0166758 A1 Jun. 3, 2021

(30) Foreign Application Priority Data

Dec. 2, 2019 (FR) ...................... 1913602

(51) Int. Cl.
*G11C 13/00* (2006.01)

(52) U.S. Cl.
CPC ...... *G11C 13/0069* (2013.01); *G11C 13/0007* (2013.01); *G11C 13/0011* (2013.01); *G11C 2013/009* (2013.01); *G11C 2213/79* (2013.01)

(58) Field of Classification Search
None
See application file for complete search history.

(56) References Cited

U.S. PATENT DOCUMENTS

| 7,785,737 B2 | 8/2010 | Teeters |
| 9,001,558 B2 | 4/2015 | Rosezin et al. |
| 2019/0341105 A1* | 11/2019 | Lee ...................... G11C 13/004 |

FOREIGN PATENT DOCUMENTS

| FR | 3061599 A1 | 7/2018 | |
| WO | WO-2018122156 A1 * | 7/2018 | ......... G11C 13/0007 |

OTHER PUBLICATIONS

Jana et al., Conductive-bridging random access memory: challenges and opportunity for 3D architecture. Nanoscale Research Letters. Dec. 1, 2015;10(1):188.
Tsuruoka et al., Redox reactions at Cu, Ag/Ta2O5 interfaces and the effects of Ta2O5 film density on the forming process in atomic switch structures. Advanced functional materials. Oct. 2015;25(40):6374-81.

(Continued)

*Primary Examiner* — J. H. Hur
(74) *Attorney, Agent, or Firm* — Wolf, Greenfield & Sacks, P.C.

(57) ABSTRACT

A memory comprising: a resistive-switching element having first and second electrodes separated by a layer of insulator; an energy storage component or load coupled to the resistive-switching element via a first switch; and a control circuit configured: to program the resistive-switching element to have a set state, wherein, in the set state, a filament forms a conducting path between the first and second electrodes; and, following a dissolution of the filament, to recover electrical energy, generated by the dissolution of the filament, from one of the first and second electrodes by activating the first switch.

13 Claims, 7 Drawing Sheets

(56) References Cited

OTHER PUBLICATIONS

Valov et al., Nanobatteries in redox-based resistive switches require extension of memristor theory. Nature communications. Apr. 23, 2013;4(1):1-9.
Wong et al., Metal-oxide RRAM. Proceedings of the IEEE. May 2, 2012;100(6):1951-70.

* cited by examiner

ENERGY RECOVERY IN FILAMENTARY RESISTIVE MEMORIES

CROSS-REFERENCE TO RELATED APPLICATION

This application claims priority to French patent application number 1913602, filed on Dec. 2, 2019, the contents of which is incorporated herein by reference in its entirety.

TECHNICAL FIELD

The present disclosure relates generally to the field of resistive memories, and more particularly to a method and circuit for recovering energy in resistive-switching memories.

BACKGROUND ART

Resistive random access memory (RRAM) is a well-known class of semiconductor memory technology that is based on the so-called "filamentary switching" effect. Examples of RRAM technologies based on filamentary switching include OxRAM (Oxide Random Access Memory) and CBRAM (conductive bridging RAM). These technologies have advantages in terms of cost, CMOS fabrication process compatibility, and ease of integration.

Memory elements of a filamentary switching RRAM often have a MIM (metal-insulator-metal) structure, the metal layers forming electrodes, which sandwich the insulator layer there-between. The memory element is initially in an initial resistive state (IRS), which is generally of high resistance. When a voltage above a certain threshold voltage is applied across the metal electrodes, a thin conductive filament is deposited across the insulator creating a conducting path, thereby causing a short circuit to occur between the two metal electrodes, and programming a low resistance state (LRS). A high resistance state (HRS) can then be programmed by applying a voltage of opposite polarity, causing the conductive filament to be dissolved.

A drawback of the programming operation of RRAM memory elements is thus that it involves non-negligible power consumption.

SUMMARY OF INVENTION

It is an aim of embodiments of the present disclosure to at least partially address one or more drawbacks in the prior art.

For example, it would be desirable to increase the overall energy efficiency of an RRAM, and in some cases to recuperate energy that can be used to power or sustain any other generic load external to the memory array. Additionally or alternatively, it would be desirable to provide an RRAM in which recuperated energy contributes to reducing or optimizing the power delivered to the supply rails of the memory array, and/or to any other active block of the integrated circuit chip integrating the memory array.

According to one embodiment, there is provided a memory comprising: a resistive-switching element having first and second electrodes separated by a layer of insulator; an energy storage component or load coupled to the resistive-switching element via a first switch; and a control circuit configured: to program the resistive-switching element to have a set state, wherein, in the set state, a filament forms a conducting path between the first and second electrodes; and, following a dissolution of the filament, to recover electrical energy, generated by the dissolution of the filament, from one of the first and second electrodes by activating the first switch.

According to one embodiment, the energy storage component or load comprises: a capacitor; or an inductor; or a resistor; or any combination of two or three of the above.

According to one embodiment, the control circuit is configured to apply a biasing voltage of a first level and having a first polarity across the first and second electrodes in order to program the set state.

According to one embodiment, the control circuit is further configured to apply a biasing voltage of a second level, and having a second polarity opposite to the first polarity, across the first and second electrodes in order to dissolve the filament.

According to one embodiment, the control circuit is further configured to apply a biasing voltage of a third level, and having the second polarity, across the first and second electrodes prior to recovering the electrical energy, the third level having a greater absolute value than the second level.

According to one embodiment, the third level is in the range −0.5 to −5 V, and for example in the range −1 to −3 V.

According to one embodiment, the third level has an absolute value that is equal to or greater than a fourth level at which a current conducted by the resistive-switching element falls to zero.

According to one embodiment, the control circuit is further configured to apply a biasing voltage of a fifth level, and having the second polarity, across the first and second electrodes prior to recovering further energy, the fifth level having a greater absolute value than the third level.

According to one embodiment, the memory comprises a second switch coupling the first electrode of the resistive-switching element to a biasing circuit, the first switch couples the first electrode of the resistive-switching element to an energy storage node, and the control circuit is configured to recover electrical energy from one of the first and second electrodes by deactivating the second switch and activating the first switch.

According to one embodiment, the memory further comprises a third switch coupling the energy storage node to the load.

According to one embodiment, the memory comprises an array formed of the resistive-switching element and a plurality of further resistive-switching elements having first and second electrodes.

According to one embodiment, the control circuit is further configured to recover electrical energy from one of the first and second electrodes of each of the further resistive-switching elements following a dissolution of the filament of each resistive-switching element.

According to one embodiment, the memory further comprises a plurality of further control circuits for controlling the plurality of further resistive-switching elements.

According to a further aspect, there is provided a method of programming a resistive-switching element having first and second electrodes, the method comprising: programming, by a control circuit, the resistive-switching element to have a set state wherein, in the set state, a filament forms a conducting path between the first and second electrodes; and following a dissolution of the filament, recovering, from one of the first and second electrodes, electrical energy generated by the dissolution of the filament by activating a first switch, the first switch coupling the resistive-switching element to a load.

According to one embodiment, programming the resistive-switching element to have the set state comprises applying, by the control circuit, a biasing voltage of a first level and having a first polarity across the first and second electrodes.

According to one embodiment, the method further comprises applying, by the control circuit, a biasing voltage of a second level, and having a second polarity opposite to the first polarity, across the first and second electrodes in order to dissolve the filament.

According to one embodiment, the method further comprises applying, by the control circuit, a biasing voltage of a third level, and having the second polarity, across the first and second electrodes prior to recovering the electrical energy, the third level having a greater absolute value than the second level.

According to one embodiment, the third level is in the range −0.5 to −5 V, and for example in the range −1 to −3 V.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
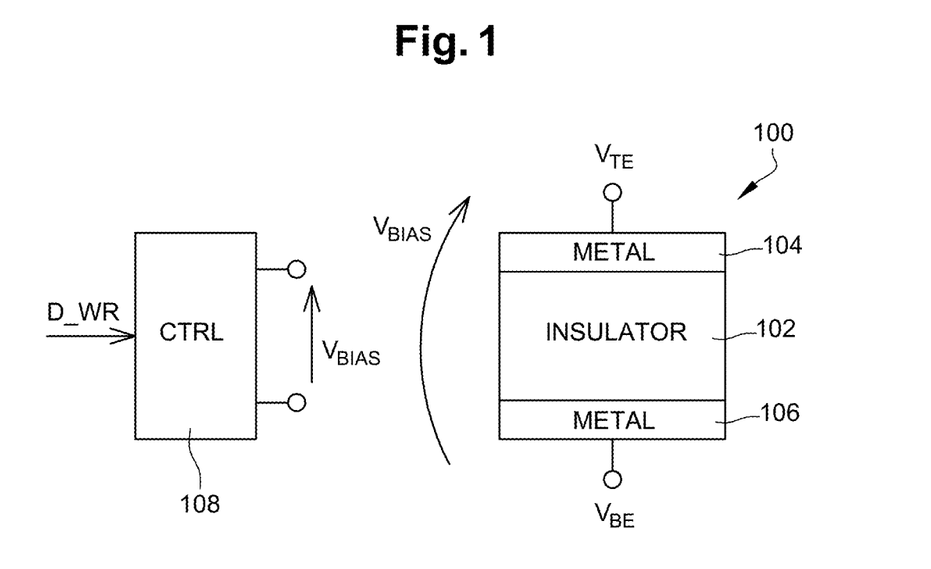
FIG. 1 schematically illustrates a resistive-switching element according to an example embodiment.

FIG. 1 schematically illustrates an example of a resistive-switching element 100 that operates based on filamentary switching. The element 100 has a MIM structure comprising a layer of insulator (INSULATOR) 102 forming an electrolyte and sandwiched between a top metal electrode (METAL) 104 at a voltage $V_{TE}$ and a bottom metal electrode (METAL) 106 at a voltage $V_{BE}$. The element 100 is capable of storing a bit of data under control of a biasing voltage $V_{BIAS}$ applied across its electrodes 104, 106.

FIG. 1 also illustrates a control circuit (CTRL) 108 configured, for example, to generate the biasing voltage $V_{BIAS}$ for applying across the electrodes of the element 100, for example based on input data D_WR to be written to the element. The control circuit 108 is also for example configured to recover electrical energy from one of the electrodes 104, 106 following a dissolution of the filament of the element 100, as will be described in more detail below.

Operation of the element 100 for data storage will now be described with reference to FIG. 2.

Figure 2:
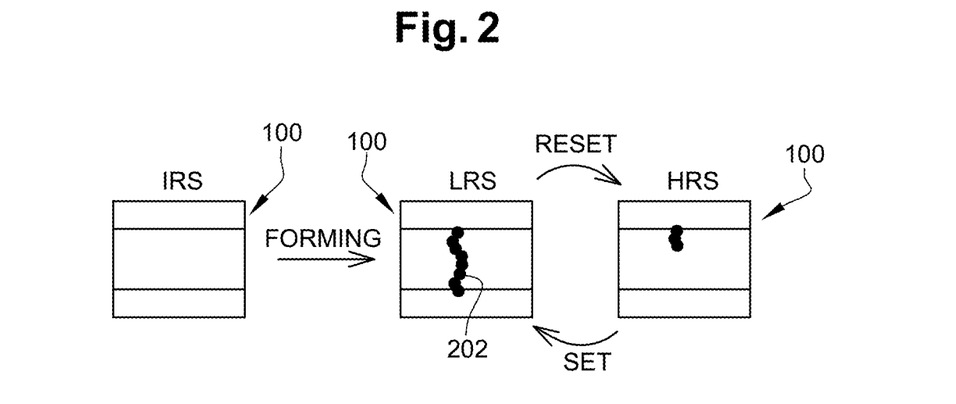
FIG. 2 illustrates an example of forming, set and reset programming phases of the resistive-switching element of FIG. 1 according to an example embodiment.

FIG. 2 illustrates an example of forming, set and reset programming phases of the resistive-switching element 100 of FIG. 1.

Prior to any programming operation, the element 100 is for example in an initial resistive state (IRS). A process known as forming or electroforming (FORMING) involves applying a biasing voltage $V_{BIAS}$ across the electrodes of the element 100 to cause a transition from the IRS state to a low resistance state (LRS).

Thereafter, the element 100 can for example be made to toggle between the low resistance state and a high resistance state (HRS), these states being respectively associated with distinguishable low and high resistance values in order to provide binary data storage. In particular, a transition from the LRS state to the HRS state is generally referred to as a reset operation (RESET), and the HRS state is generally considered to correspond to a logic "0" state or OFF state. A transition from the HRS state to the LRS state is generally referred to as a set operation (SET), and the LRS state is generally considered to correspond to a logic "1" state or ON state.

Transitioning from the IRS or HRS state to the LRS state involves applying a biasing voltage $V_{BIAS}$ across the resistive-switching element 100 in order to form a filament 202 across the insulating layer 102. This filament forms a conducting path between the electrodes 104, 106, thereby short circuiting the electrodes.

Transitioning from the LRS state to the HRS state involves at least partially dissolving the filament 202 such that there is no longer a short circuit between the electrodes 104, 106 of the device. As explained in more detail below, in some cases, the filament may self-dissolve, while in other cases, the filament is caused to dissolve by applying a biasing voltage $V_{BIAS}$ of opposite polarity to the one used for the SET operation.

The particular mechanism that causes the creation and dissolution of the filament across the insulating layer 102 depends on the particular technology of the resistive-switching element, and will not be described in detail herein. For example, conductive bridge RAM is described in more detail in the publication by D. Jana et al. entitled "*Conductive-bridging random access memory: challenges and opportunity for 3D architecture*", Nanoscale Research Letters, 2015. Oxide Random Access Memory is for example described in more detail in the publication by H. S. Philip Wong et al. entitled "Metal-Oxide RRAM", Proceedings of the IEEE, 2012. The contents of these two publications is for example incorporated herein by reference to the extent permitted by the law.

Figure 3:
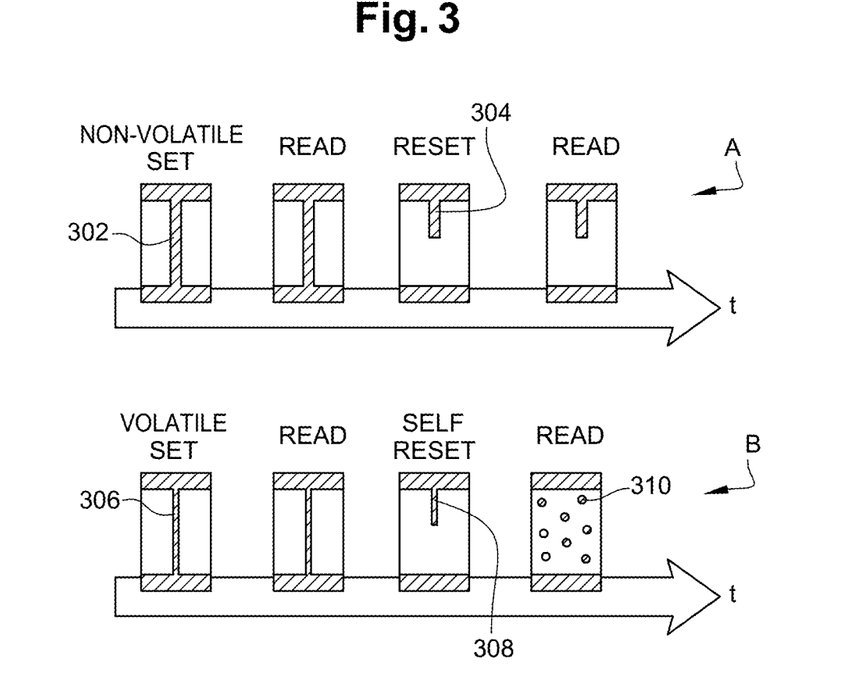
FIG. 3 schematically represents non-volatile and volatile programming cycles of a resistive-switching element according to an example embodiment.

FIG. 3 schematically represents non-volatile and volatile programming cycles of a resistive-switching element such as the element 100 of FIG. 1.

A sequence A in FIG. 3 represents a non-volatile programming cycle, which for example involves a non-volatile set operation (NON-VOLATILE SET) creating a filament 302 between the electrodes of the element. The operation is considered non-volatile because enough power is applied to the element during the set process that the resulting filament is relatively thick, and therefore is not dissolved in the absence of an external bias. For example, the non-volatile LRS state is maintained for a relatively long duration, such as months or years.

Sometime later, the LRS state is for example read during a read operation (READ), involving detecting the low resistance state of the element and outputting the associated logic level, which is for example a logic "1".

When the element is next to be programmed at the high resistance state, a reset operation (RESET) is applied by biasing the element with a biasing voltage $V_{BIAS}$ of opposite polarity to the one used during the set operation. The result is for example that only a portion 304 of the filament 302 remains, and thus there is a relatively high resistance between the electrodes of the element. This reset state is always non-volatile in that the filament will not be reformed in the absence of an appropriate biasing voltage $V_{BIAS}$ applied across the electrodes.

Like for the LRS state, sometime later, the HRS state is for example read during a further read operation (READ), involving detecting the high resistance state of the element and outputting the associated logic level, which is for example a logic "0".

A sequence B in FIG. 3 represents a volatile programming cycle, which for example involves a volatile set operation (VOLATILE SET) creating a filament 306 between the electrodes of the element. The operation is considered volatile because relatively low power is applied to the element during the set process and so the resulting filament 306 is relatively thin, and will tend to self-dissolve after a limited time window, which will be referred to herein as a retention time window. For example, the volatile LRS state is maintained for a relatively short duration of between 1 µs and several days, and in some embodiments of two days at most.

A short time later, and before the LRS state self-dissolves, the LRS state is for example read during a read operation (READ), involving detecting the low resistance state of the element and outputting the associated logic level, which is for example a logic "1". In some embodiments, a DRAM (dynamic RAM) operation is applied according to which elements programmed to have the LRS state are refreshed by a new volatile set if they are to store their data beyond the end of the retention time window. In such a case, the read operation is for example part of a refresh operation of the element, and after reading the LRS state, this state is reprogrammed in order to extend the data storage duration.

A self reset event (SELF RESET) for example occurs at the end of the retention time window. The result of this self reset event is for example that only a portion 308 of the filament 306 remains, and thus there is a relatively high resistance between the electrodes of the element.

Sometime later, this time lapse not being limited by any time window, the HRS state is for example read during a further read operation (READ), involving detecting the high resistance state of the element and outputting the associated logic level, which is for example a logic "0". As represented by dots 310 in FIG. 3, by the time of the read operation the conductive particles of the filament may have entirely dissolved and dispersed in the insulator.

It has been shown that an electromotive force is generated by programing operations of a resistive-switching element, this force appearing in the form of a non-zero voltage, which will be called Vemf, across the electrodes of the element. For example, the existence of such a force was described in the French patent applications published as FR3061599 and FR3066043, the content of these applications being incorporated herein by reference to the extent permitted by the law.

For example, the following table provides approximate measured voltages $V_{CELL}$ for CBRAM and OxRAM elements having different materials for the top electrode (TE), the insulator (INSUL) and the bottom electrode (BE). The voltage $VC_{ELL}$ is a voltage measured across the cells electrodes in open circuit conditions after "charging".

TABLE 1

| Technology | Materials of TE/INSUL/BE | $V_{CELL}$ (mV) |
|---|---|---|
| CBRAM | Cu/SiO$_2$/Pt | 300 |
|  | Ag/SiO$_2$/Pt | 150 |

TABLE 1-continued

| Technology | Materials of TE/INSUL/BE | $V_{CELL}$ (mV) |
|---|---|---|
| | Ag/GeS$_x$/Pt | 120 |
| | Ag/GeSe$_x$/Pt | 100 |
| | Cu/WO$_3$/Pt | 40 |
| | Ag/AgI/Pt | 2 |
| OxRAM | Pt/SrTiO$_3$/Ti (as deposited) | 200 |
| | Pt/SrTiO$_3$/Ti | 1.5 |
| | Pt/Ta$_2$O$_5$/Ta | 0.05 |

The present inventors propose a method and circuit for harvesting the energy resulting from this electromotive force, as will now be described with reference to FIGS. 4 to 14.

Figure 4:
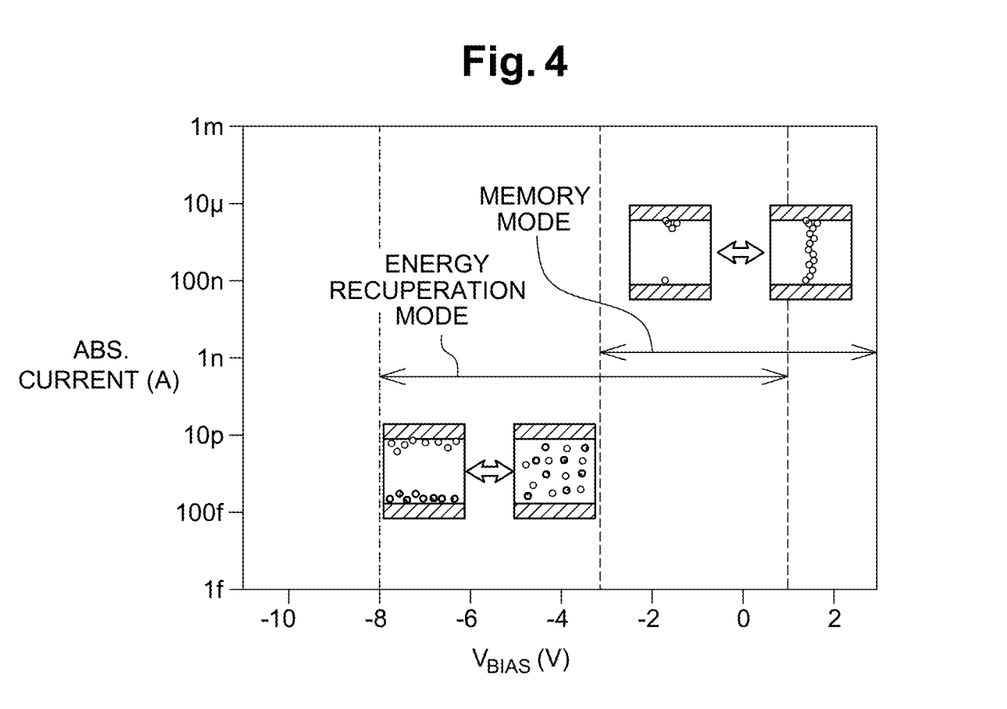
FIG. 4 is a graph representing an example of operating voltage and current ranges for a memory mode and an energy recuperation mode of a resistive-switching element according to an example embodiment of the present disclosure.

FIG. 4 is a graph representing an example of operating voltage $V_{BIAS}$ and current ranges for a memory mode and an energy recuperation mode of a resistive-switching element according to an example embodiment of the present disclosure.

The memory mode corresponds to the use of the programming cycles of the resistive-switching element for data storage, as described above in relation with FIG. 3. The memory mode for example involves applying biasing voltages $V_{BIAS}$ across the electrodes of the resistive-switching element in the range of around −3 to 3 V, with currents anywhere in the range of 1 fA to 1 mA, and preferably of 1 μA to 100 μA.

The energy recuperation mode corresponds to the presence, while not in the set state, of a voltage across the electrodes of the resistive-switching element, which can be harvested. In the example of FIG. 4, the energy recuperation mode is compatible with voltages in the range from −8 V up to the voltage at which the filament is formed, which is for example at around 1 V. The present inventors have found that, as long as the filament is not formed, the energy recuperation mode is, however, more generally compatible with biasing voltages $V_{BIAS}$ in the range from around −10 to 10 V, and for example in the range from −5 to 5 V, and with currents anywhere in the range of 1 fA to 1 mA, and preferably of 1 μA to 100 μA.

There is thus an overlapping biasing voltage range between the memory mode and the energy recuperation mode from around −3 V to around 1 V. The present inventors propose to exploit this range in order to harvest energy during memory programming cycles. In some cases, the biasing voltage $V_{BIAS}$ may be brought below −3 V during the energy recovery. For example, the voltage is varied in the range between −5 and 1 V.

Figure 5:
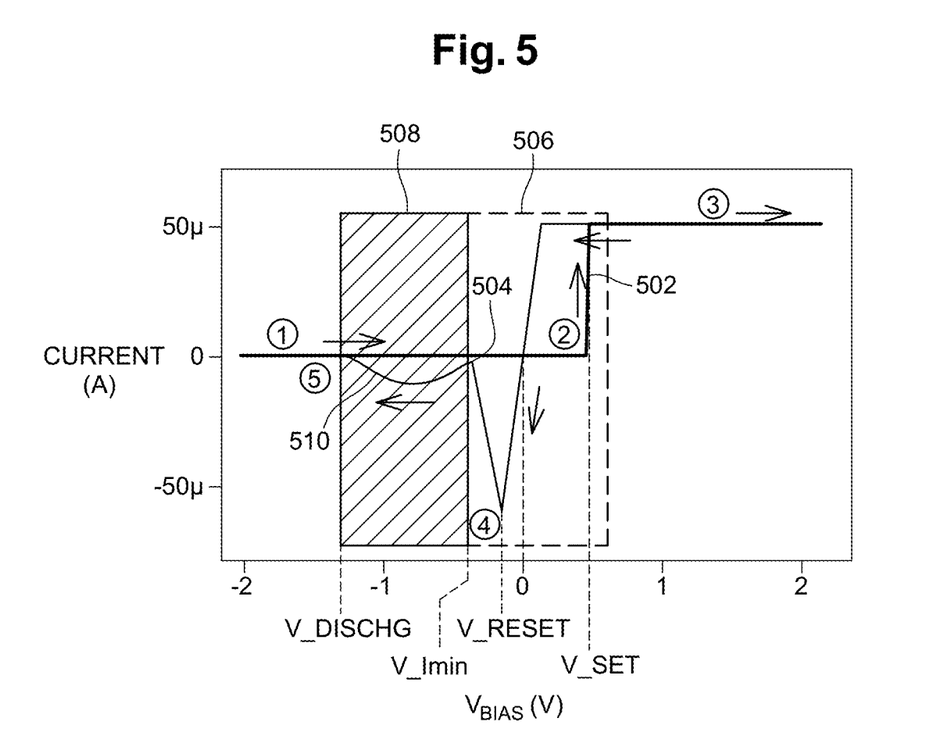
FIG. 5 is a graph representing current and voltage during a programming and energy recovery cycle of a resistive-switching element according to an example embodiment of the present disclosure.

FIG. 5 is a graph representing a current and biasing voltage $V_{BIAS}$ during a programming and energy recovery cycle of a resistive-switching element according to an example embodiment of the present disclosure. This graph was obtained by a technique of quasi-static memory characterization involving biasing the resistive-switching element with a ramping voltage source corresponding to the voltage $V_{BIAS}$ across the two electrodes of the element, while measuring the current across the electrodes. The biasing voltage $V_{BIAS}$ is swept from a negative voltage of relatively high absolute value to a positive voltage of relatively high absolute value, and back again, in order to characterize the behavior of the element during a programming cycle.

In the example of FIG. 5, the biasing voltage $V_{BIAS}$ starts at a point (1) at around −2 V. The resistive-switching element is for example in the IRS or HRS state. In this state, the resistive-switching element undergoes no change by the external bias, as substantially no ion is being produced, and no electromotive force can thus arise.

The biasing voltage $V_{BIAS}$ across the electrodes of the element is then increased, for example by a voltage ramp. At a certain positive voltage level, equal for example to between 0.1 and 0.5 V, the interface between the top electrode and electrolyte layer starts to undergo oxidation, and metal cations are released inside the electrolyte. For example, this occurs in accordance with the general expression:

$$Me \rightarrow Me^{Z+} + ze^- \qquad [Math\ 1]$$

where Me is the metal of the top electrode, and z is the number of electrons produced in the process.

An electromotive force starts to arise mainly due to the ionic gradient present inside the electrolyte layer. As the voltage increases further, the oxidation is enhanced and more metal ions are produced and consequently either diffuse or are swept by the electric field to the bottom electrode, where they are reduced, and lose their charged state.

Eventually, enough atoms pile up and bridge the two electrodes of the resistive-switching element, thus allowing the current to jump to a compliance value, which is for example set in the range 1 to 100 μA, and for example at around 50 μA in the example of FIG. 5, corresponding in this case to a non-volatile set operation. This is represented by a rising edge 502 of the current-voltage curve, which for example occurs at a voltage V_SET, equal to around 0.5 V in the example of FIG. 5. The element has thus reached its SET state at (3), and any electromotive force across the electrodes is lost due to the presence of the short circuit. Therefore, in some embodiments, the biasing voltage $V_{BIAS}$ is not increased much higher than the voltage V_SET, and for example not more than around V_SET+0.5 V, equal to around 1 V in the example FIG. 5.

When the biasing voltage $V_{BIAS}$ is then swept in the opposite direction, the filament is stable until enough energy is provided to dissolve it. As the biasing voltage $V_{BIAS}$ approaches 0 V, the current starts to fall rapidly, and turns negative when the voltage becomes negative. At (4), the biasing voltage $V_{BIAS}$ reaches a level of V_RESET, equal to around −0.15 V in the example of FIG. 5, and dissolution occurs, which corresponds to the reset taking place. For some types of resistive-switching memory, this is for example a mainly thermic reset process, which occurs due to Joule heating. Thereafter, as the biasing voltage $V_{BIAS}$ becomes more negative, a reduction in metal cations coming from the dissolving filament becomes the dominant contribution. The general reduction can be written as:

$$Me^{Z+} + ze^- \rightarrow Me \qquad [Math\ 2]$$

The current has a trough 504 when the biasing voltage $V_{BIAS}$ reaches a level V_Imin, equal to around −0.4 V in the example of FIG. 5.

The voltage range from V_Imin to a little over V_SET, for example V_SET plus between 1 and 10 percent, represented by a dashed rectangle 506 in FIG. 5, corresponds for example to the memory programming voltage range. However, the present inventors have found that, following the dissolution of the filament, a more negative voltage range from V_Imin to a discharged level V_DISCHG at (5), and represented by a shaded rectangle 508 in FIG. 5, is associated with a further current peak 510, corresponding to a peak electromotive force. This peak corresponds to a reduction peak, and the voltage range 508 from V_Imin to V_DISCHG corresponds to a deep reduction regime. Indeed, at (5), when the biasing voltage $V_{BIAS}$ is equal to or lower than V_DISCHG, a major number of metal cations have been either reduced back to the top electrode of the resistive-switching element and have lost their charge, or they have been attracted to the TE/electrolyte interface. As a result, at (5), an electromotive force is obtained by stopping the voltage in the shaded area 508, in other words by reducing the voltage to a final level within the range V_Imin to V_DISCHG, and then placing the resistive-switching element in open circuit. The final voltage level is for example determined during a calibration step in order to achieve a relatively high, or maximum, electromotive force Vemf. In the example of FIG. 5, the voltage V_DISCHG is equal to around −1.3 V. The present inventors have found that the closer the reset voltage gets to the level V_DISCHG corresponding to the negative limit of the deep reduction regime, the greater the energy that can be recovered. Indeed, the maximum charge that can be generated is met when this point is reached, as below this point, the reaction resulting in the charge generation ceases to occur. However, applying a more negative voltage is likely to also consume more energy than applying a less negative voltage, and therefore the calibration step can be used to find an optimum or close to optimum voltage level to be applied for energy recuperation.

Methods of exploiting the effects indicated above in relation with FIG. 5 in order to recover energy during non-volatile and volatile programming cycles of a resistive-switching element will now be described with reference to FIGS. 6, 7, 8 and 9.

Figure 6:
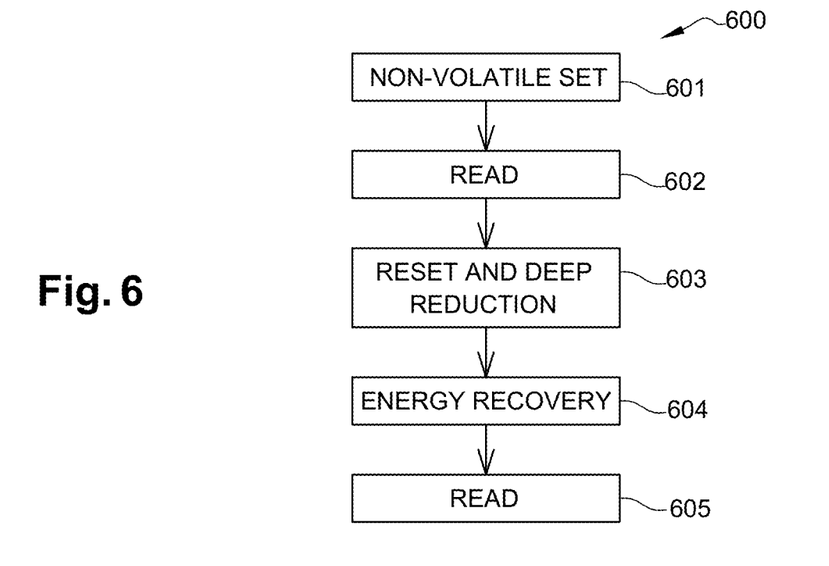
FIG. 6 is a flow diagram schematically illustrating operations in a method of non-volatile programming and energy recovery in a resistive-switching element according to an example embodiment of the present disclosure.

FIG. 6 is a flow diagram schematically illustrating operations in a method 600 of non-volatile programming and energy recovery in a resistive-switching element according to an example embodiment of the present disclosure. This method is for example implemented by the control circuit 108 of FIG. 1.

Figure 7:
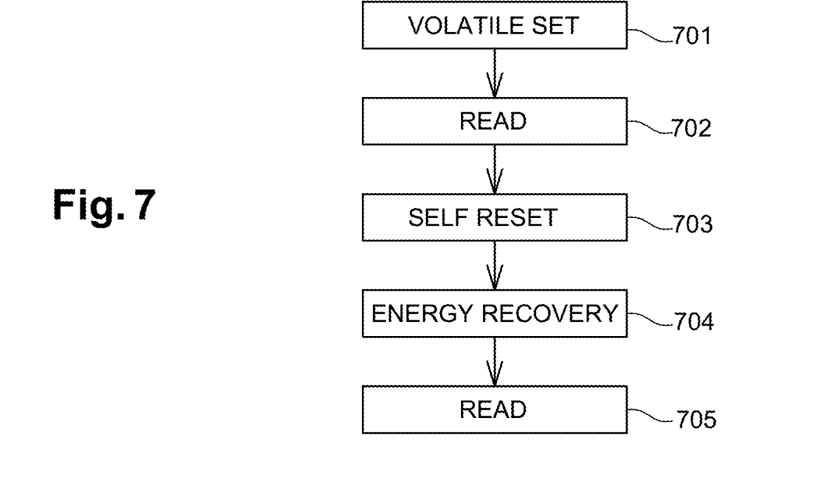
FIG. 7 is a flow diagram schematically illustrating operations in a method of volatile programming and energy recovery in a resistive-switching element according to an example embodiment of the present disclosure.

FIG. 7 is a flow diagram schematically illustrating operations in a method 700 of volatile programming and energy recovery in a resistive-switching element according to an example embodiment of the present disclosure. This method is also for example implemented by the control circuit 108 of FIG. 1, and may for example be performed in addition to the method of FIG. 6. For example, the control circuit 108 is capable of both volatile and non-volatile programming of a same resistive-switching element.

While in the methods of FIGS. 6 and 7 one or more read operations are for example performed to read the programmed state of the resistive-switching element, in the case that the memory mode is not required, these read operations could be omitted, resulting in an energy storage and recuperation mode, similar to a battery function.

Figure 8:
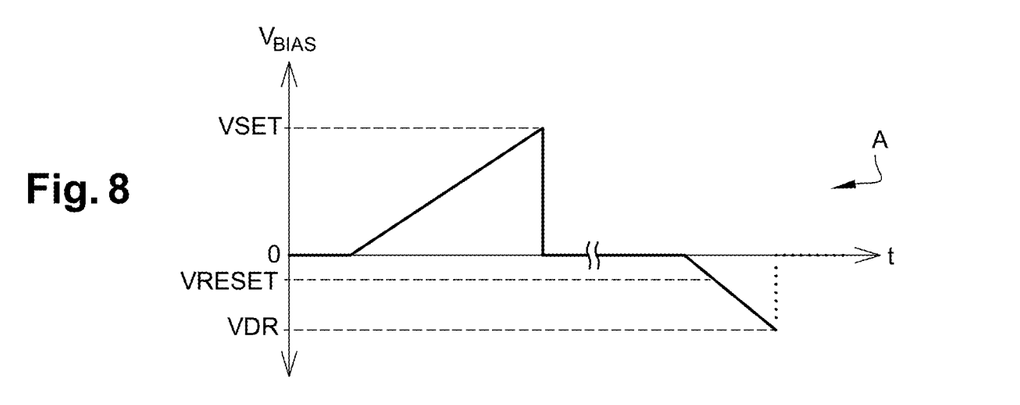
FIG. 8 is a timing diagram representing an example of voltage levels during non-volatile and volatile programing cycles of a resistive-switching element according to an example embodiment of the present disclosure.
Figure 9:
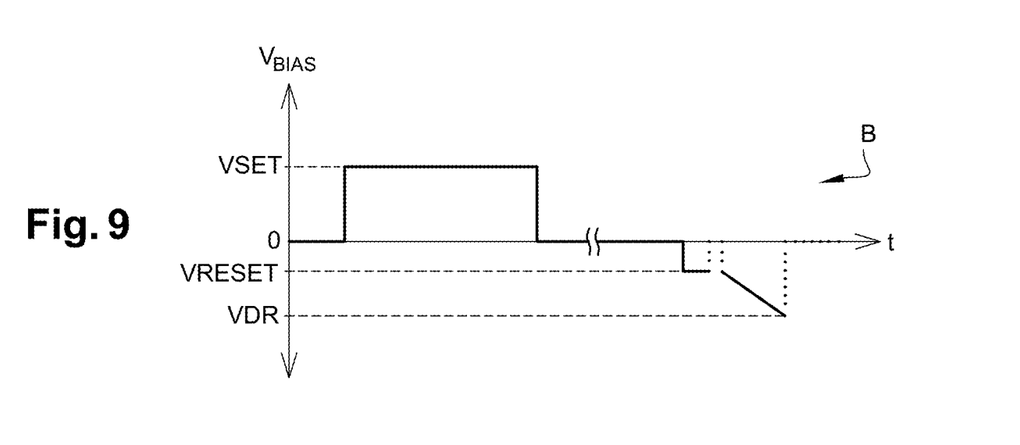
FIG. 9 is a timing diagram representing an example of voltage levels during non-volatile and volatile programing cycles of a resistive-switching element according to a further example embodiment of the present disclosure.

FIGS. 8 and 9 are timing diagrams representing examples of levels of the biasing voltage $V_{BIAS}$ during non-volatile and volatile programing cycles of a resistive-switching element.

With reference first to FIG. 6, the non-volatile programming and energy recovery cycle for example starts with an operation 601, in which a non-volatile set (NON-VOLATILE SET) is performed.

For example, as represented by the solid curve in FIG. 8, the non-volatile set is performed by applying a voltage ramp to bring the biasing voltage $V_{BIAS}$ from 0 V to a SET voltage VSET, where this SET voltage is for example equal to or higher to the level V_SET of FIG. 5. In some embodiments, the voltage VSET is in the range 0.5 to 2 V. At the end of the SET operation, the resistive-switching element is for example placed in open circuit, to interrupt any biasing voltage $V_{BIAS}$ across the element.

Alternatively, as represented by a solid curve in FIG. 9, the non-volatile set is performed by applying a uniform voltage pulse at the SET voltage VSET. Again, the voltage VSET is for example equal to or higher to the level V_SET of FIG. 5. In some embodiments, the voltage VSET in the example of FIG. 9 is in the range 0.3 to 1.5 V Like for the voltage ramp of FIG. 8, at the end of the uniform voltage pulse of FIG. 9, the resistive-switching element is for example placed in open circuit, to interrupt any biasing voltage $V_{BIAS}$ across the cell.

Whatever the form of the voltage, during the non-volatile SET operation, the current through the resistive-switching element is for example limited to a compliance current, which is for example of at least 20 μA, and for example in the range 20 μA to 200 μA, and in some cases in the range 50 μA to 100 μA. For example, the resistive-switching element is coupled or connected in series with a transistor, as shown for example in FIG. 14 below. This transistor is for example gate-biased by a voltage level controlled such that the maximum current is limited to the compliance current.

With reference again to FIG. 6, in an operation 602, a read operation (READ) is then for example performed, to read the SET state programmed in operation 601. This operation for example involves measuring a current passing through the resistive-switching element while a read voltage is applied to the element, or measuring a voltage across the resistive-switching element while a read current is passed through the element. Such a read operation is well known in the art and will not be described in more detail.

In an operation 603, reset and deep reduction (RESET AND DEEP REDUCTION) is performed.

For example, as represented by the solid curve in FIG. 8, this involves applying a negative biasing voltage $V_{BIAS}$ in the form of a ramp starting, for example, at 0 V and falling to a negative deep reduction voltage VDR. The ramp for example has a duration of over 1 ms, and for example of 5 ms or more. Alternatively, rather than a ramp, a constant voltage could be applied for a similar time duration to the ramp, at the negative deep reduction voltage VDR. The voltage VDR is for example lower than the voltage VRESET causing the reset process to occur, and is also lower than the voltage V_Imin of FIG. 5, at which the current falls to the low 504. In some embodiments, the voltage VDR is in the range −0.5 to −5 V, and for example in the range −1 to −2 V. At the end of the negative ramp or constant voltage, the resistive-switching element is for example placed in open circuit, the biasing voltage being represented in FIG. 8 by a dotted line during the open circuit period. Indeed, if the biasing voltage $V_{BIAS}$ were to be reduced to 0 V while being applied to the resistive-switching element, this would effectively short-circuit the electrodes of the element across which it is desired to recuperate energy, forcing the electromotive force Vemf of the cell to 0 V.

Alternatively, as represented by the solid curve in FIG. 9, the reset and deep reduction operation involves applying a negative pulse corresponding to a biasing voltage $V_{BIAS}$ at the level of VRESET, and then, for example after placing the resistive-switching element in open circuit, applying a ramp starting at VRESET, and then falling to the negative deep reduction voltage VDR. Again the voltage VDR in FIG. 9 is for example lower than the voltage VRESET causing the reset process to occur, and is also lower than the voltage V_Imin of FIG. 5, at which the current falls to the low 504. In some embodiments, the voltage VDR is in the range −1 to −5 V, and for example in the range −1 to −2 V. At the end of the negative ramp, the resistive-switching element is for example placed in open circuit, as represented by a dotted line in FIG. 9.

With reference again to FIG. 6, in an operation 604, energy recovery (ENERGY RECOVERY) is for example performed. In particular, energy that was generated by the dissolution of the filament is at least partially recovered. This for example involves transferring charge present at the top electrode of the resistive-switching element to a capacitor or other storage means or load. This energy recovery operation is for example performed relatively soon after the reset operation, as it has been found that the voltage present across the element due to electromotive force tends to disappear after a certain duration ranging from a few seconds to several hundred seconds, depending on the technology of the element. For example, the energy recovery operation is performed within 5 seconds of the reset operation, and in some cases within 1 second or even within 100 ms of the reset operation.

After the energy recovery operation 604, a further read operation (READ) 605 is for example performed in order to read the reset state of the element, this operation being performed in a similar manner to the read operation 602. Advantageously, this further read operation of the reset state is performed after the energy recovery operation, thereby recovering energy that would otherwise be lost during the read operation.

With reference now to FIG. 7, the volatile programming and energy harvesting cycle for example starts with an operation 701, in which a volatile set (VOLATILE SET) is performed. This operation for example involves applying the same voltages as in the example of FIG. 8 or 9 discussed above. However, whatever the form of the voltage, during the volatile SET operation, the current through the resistive-switching element is for example limited to a compliance current lower than the one used for a non-volatile set operation. For example, the compliance current is limited to a level of less than 20 μA, and for example to a level in the range 100 fA to 20 μA, and in some cases to a level in the range 1 nA to 10 μA.

In an operation 702, a read operation (READ) is then for example performed, to read the SET state programmed in operation 701. This operation for example involves measuring a current passing through the resistive-switching element while a read voltage is applied to the element, or measuring a voltage across the resistive-switching element while a read current is passed through the element. Such a read operation is well known in the art and will not be described in more detail. The read operation is for example performed within the retention time window of the volatile SET state, which for example depends on the compliance current and duration of the SET operation. Indeed, after the retention time window, the filament will dissolve spontaneously, after which the SET state can no longer be read.

In an operation 703, self reset occurs. As indicated above, this for example occurs at the end of the retention time window of the resistive-switching element. Thus, whereas in the examples of FIGS. 8 and 9 negative biasing voltages are applied in order to perform a reset operation following a programmed non-volatile set state, for a programmed volatile set state, the resistive-switching element is for example kept in open circuit and self reset occurs naturally.

In an operation 704, energy recovery (ENERGY RECOVERY) is for example performed. In particular, energy that was generated by the dissolution of the filament is at least partially recovered. Like in the case of non-volatile programming, this for example involves transferring charge present at the electrodes of the resistive-switching element to a capacitor or other storage means or load, as will be described in more detail below with reference to FIG. 10. However, in this case, there is for example no reset voltage VRESET or deep reduction voltage VDR applied to the element.

Alternatively, it would also be possible to apply a reset voltage VRESET and/or deep reduction voltage VDR in the energy recovery operation 704, for example in order to increase the amount of recuperated energy. This energy recovery operation is for example performed relatively soon after the reset operation, as it has been found that the voltage present across the element due to electromotive force tends to disappear after a certain duration ranging from a few seconds to several hundred seconds, depending on the technology of the element. For example, the energy recovery operation is performed within 5 seconds of the reset operation, and in some cases within 1 second or even within 100 ms of the reset operation. In some embodiments, the energy recovery using the reset voltage VRESET and/or deep reduction voltage VDR is performed during each refresh cycle of the resistive-switching element described above. For example, the set state read in the read operation 702 is written back during the refresh operation following the energy recovery.

In some embodiments, after the energy recovery operation 704, a further read operation (READ) 705 is performed in order to read the reset state of the element, this operation being performed in a similar manner to the read operation 702.

Figure 10:
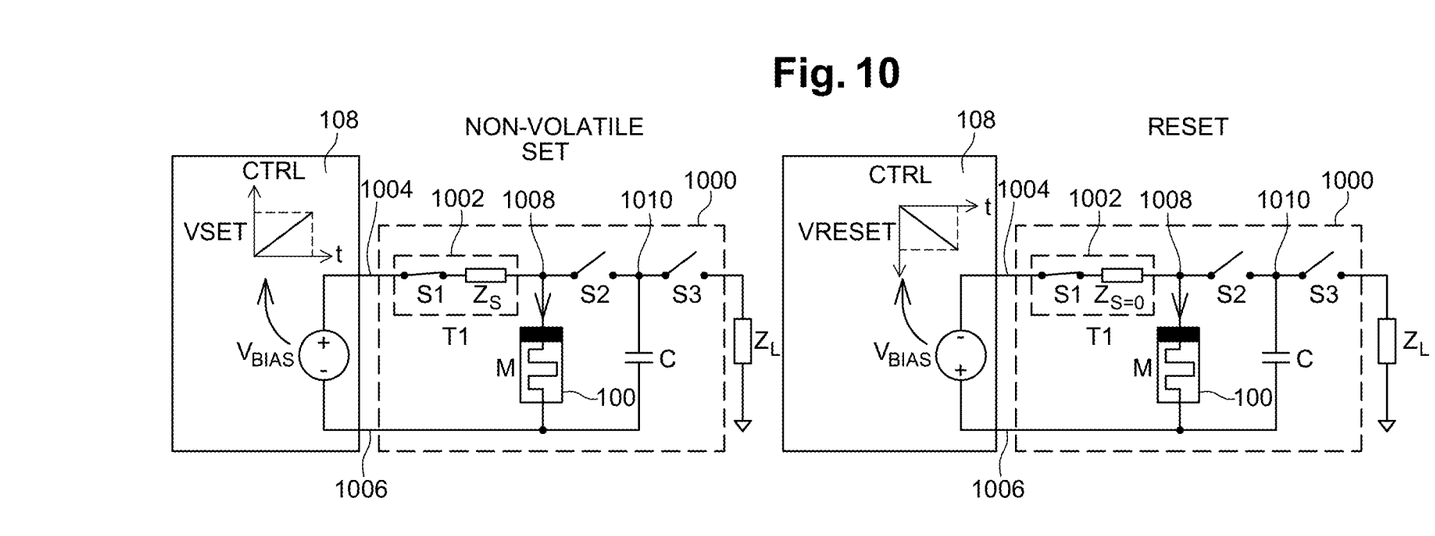
FIG. 10 schematically illustrates set and reset operations during non-volatile programming of a memory circuit comprising a resistive-switching element according to an example embodiment of the present disclosure.

FIG. 10 schematically illustrates set and reset operations during non-volatile programming of a memory circuit 1000 comprising the resistive-switching element 100. The memory circuit 1000 for example comprises the series connection of a switch S1 and the resistive-switching element 100 between input/output lines 1004 and 1006 of the control circuit 108, the biasing voltage $V_{BIAS}$ being provided across these lines 1004, 1006. The switch S1 is for example implemented by a transistor T1 having an ON resistance $Z_s$. An intermediate node 1008 between the switch S1 and the element 100 is for example coupled to an energy storage node 1010 via a switch S2. A capacitor C for example provides this energy storage, and is coupled between the energy storage node 1010 and the input/output line 1006. A switch S3 is for example coupled between the node 1010 and a load $Z_L$. The load $Z_L$ is for example a resistive and/or inductive load.

The switches S1, S2 and S3 are for example controlled by the control circuit 108.

In alternative embodiments, the switches S2 and S3, capacitor C and load $Z_L$ could be replaced by any charge storage component or inductive and/or resistive load coupled to the element 100 via one or more switches.

FIG. 10 shows, on the left, the non-volatile set operation (NON-VOLATILE SET) during which the switch S1 is conducting, and the switches S2 and S3 are in open-circuit. Furthermore, the control circuit 108 provides the biasing voltage $V_{BIAS}$ for setting the element 100, for example using a positive voltage ramp or other waveform.

FIG. 10 also shows, on the right, the reset operation (RESET) during which the switches S1, S2 and S3 are controlled in the same manner as for the SET operation, and the control circuit 108 provides the biasing voltage $V_{BIAS}$ for resetting the element 100, for example using a negative voltage ramp or other waveform.

Figure 11:
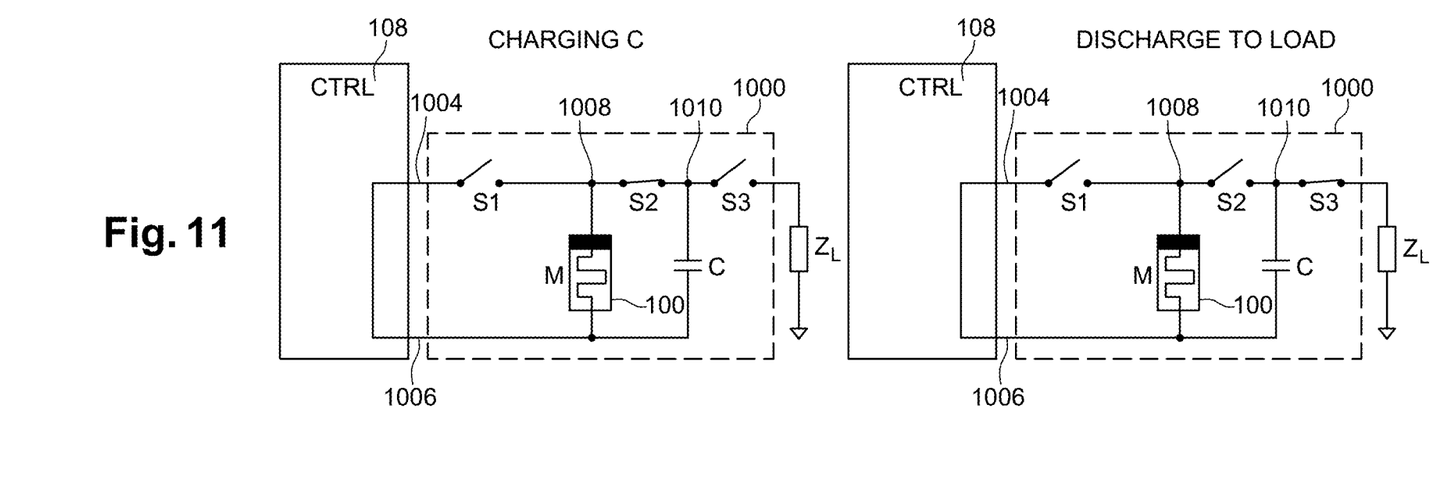
FIG. 11 schematically illustrates capacitor charging and discharging operations of the memory circuit of FIG. 10 according to an example embodiment of the present disclosure.

FIG. 11 schematically illustrates capacitor charging and discharging operations of the memory circuit 1000 of FIG. 9 during energy recovery.

FIG. 11 shows, on the left, the charging operation (CHARGING C) during which the switches S1 and S3 are for example in open circuit, and the switch S2 is conducting. Thus, the node 1008 is coupled to the capacitor C, and the charge present across the element 100 is for example transferred to the capacitor C. For example, as described in more detail below, in a memory array of resistive-switching elements, the recuperated energy from each element is used to power or sustain any generic load external to the memory array. Additionally or alternatively, the recuperated energy for example contributes to reducing or optimizing the power delivered to the supply rails of the memory array, and/or to any other active block of the integrated circuit chip integrating the memory array.

FIG. 11 also shows, on the right, the discharging operation (DISCHARGE TO LOAD) during which the switches S1 and S2 are for example in open circuit, and the switch S3 is conducting. Thus, the charge stored on the capacitor C is transferred to the load. For example, in one embodiment the load could be a circuit for charging a battery, or any other type of load.

Figure 12:
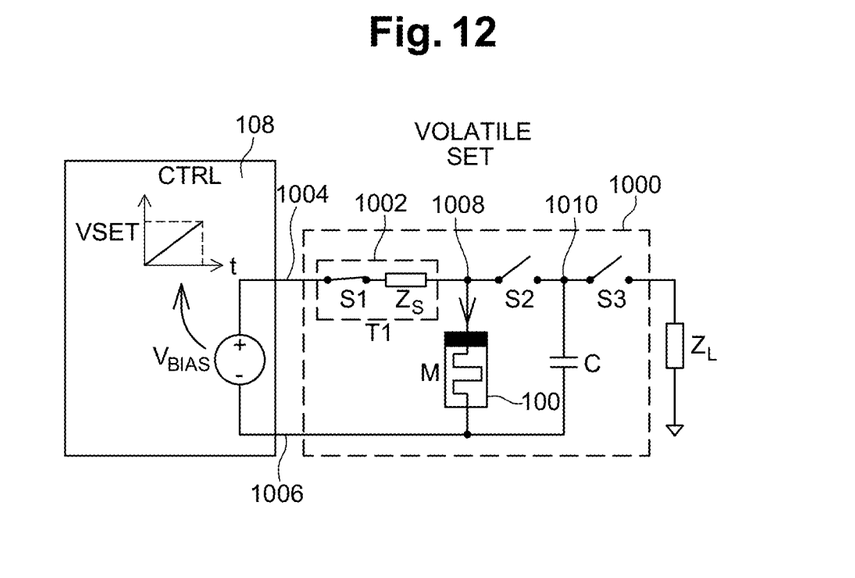
FIG. 12 schematically illustrates a set operation during volatile programming of the memory circuit of FIG. 10 according to an example embodiment of the present disclosure.

FIG. 12 schematically illustrates a set operation during volatile programming of the memory circuit 1000 of FIGS. 10 and 11.

FIG. 12 shows the volatile set operation (VOLATILE SET) during which the switch S1 is conducting, and the switches S2 and S3 are in open-circuit. Furthermore, the control circuit 108 provides the biasing voltage $V_{BIAS}$ for setting the element 100, for example using a positive voltage ramp or other waveform. However, as explained above, the control circuit 108 is for example configured to limit the current through the element 100 to a relatively low compliance current, leading to a volatile set operation.

The volatile set operation of FIG. 12 is for example followed by capacitor charging and discharging operations, which are for example the same as those of FIG. 11, and will not be described again in detail.

While in the embodiments described above energy is recovered from the resistive-switching element in a single transfer, in alternative embodiments, the energy could be recovered progressively, as will now be described in more detail with reference to FIG. 13.

Figure 13:
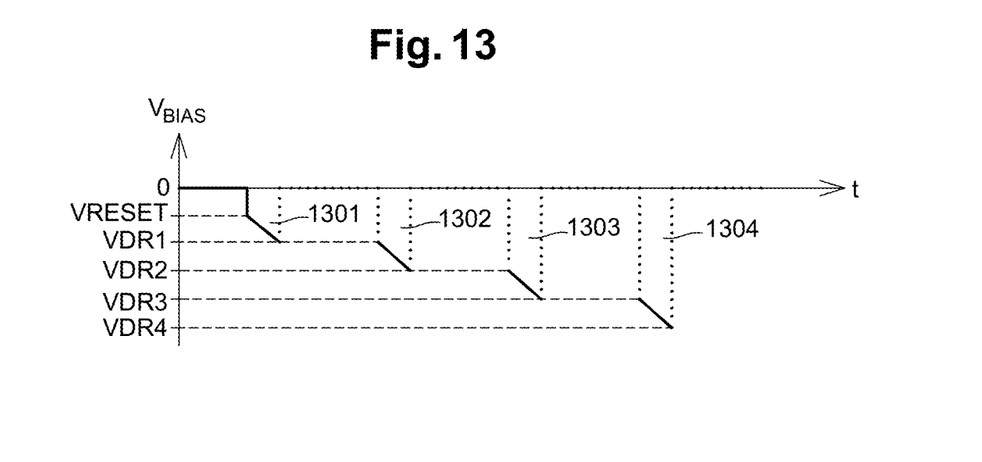
FIG. 13 is a timing diagram representing an example of voltage levels during a reset and deep reduction operation of a resistive-switching element according to an example embodiment of the present disclosure.

FIG. 13 is a timing diagram representing an example of levels of the biasing voltage $V_{BIAS}$ during a reset and deep reduction operation of a resistive-switching element according to an example embodiment of the present disclosure.

The biasing voltage $V_{BIAS}$ is for example progressively reduced by applying a series of negative voltage ramps having increasing absolute levels. Each of the ramps is for example a quasi-static ramp in that the voltage variation is relatively slow with respect to the ramp duration, which is for example of 1 ms or more. In the example of FIG. 13, a first ramp 1301 has an absolute amplitude that increases over time, for example in a linear manner, from the level VRESET to a level VDR1, which is more negative than VRESET. Similarly, a second ramp 1302 increases from the level VDR1 to a level VDR2, which is more negative than VDR1, a third ramp 1303 increases from the level VDR2 to a level VDR3, which is more negative than VDR2, and a fourth ramp 1304 increases from the level VDR3 to a level VDR4, which is more negative than VDR3. In between each ramp and at the end of the final ramp, the resistive-switching element is for example placed in open circuit, as represented by a dotted line in FIG. 13.

Energy is for example recovered from the resistive-switching element following each of the ramps VDR1 to VDR4. The timing between the ramps may vary, and be selected as a function of the energy needs of the circuit.

In alternative embodiments, there could be only two or three ramps, or more than four ramps, in the series. The resistive-switching element is for example placed in open-circuit between each ramp. The level of each ramp VDR1 to VDRn, where n is the final ramp, is for example in the range −0.5 to −5 V, and for example in the range −0.5 V to −2 V. The levels and durations of each ramp and the number of ramps are for example chosen such that only the final ramp VDRn causes the current through the element to fall to zero, corresponding to the point at V_DISCHG of FIG. 5. In some embodiments, rather than using a fixed number of ramps, the ramps are stopped based on the detection of a peak current corresponding to the peak 510 of FIG. 5. For example, if p ramps have been applied to bring the current to the peak 510, the ramps are stopped after a further p ramps have been applied. Alternatively, in some cases the detection of the current peak may be rendered difficult due to leakage or tunneling currents. Therefore, rather than detecting the current peak, the voltage value of $V_{BIAS}$ at which to stop could be found, during a calibration step, by cycling over increasingly negative voltages until a level is found below which the voltage Vemf across the cell reaches a maximum and does not increase anymore.

Figure 14:
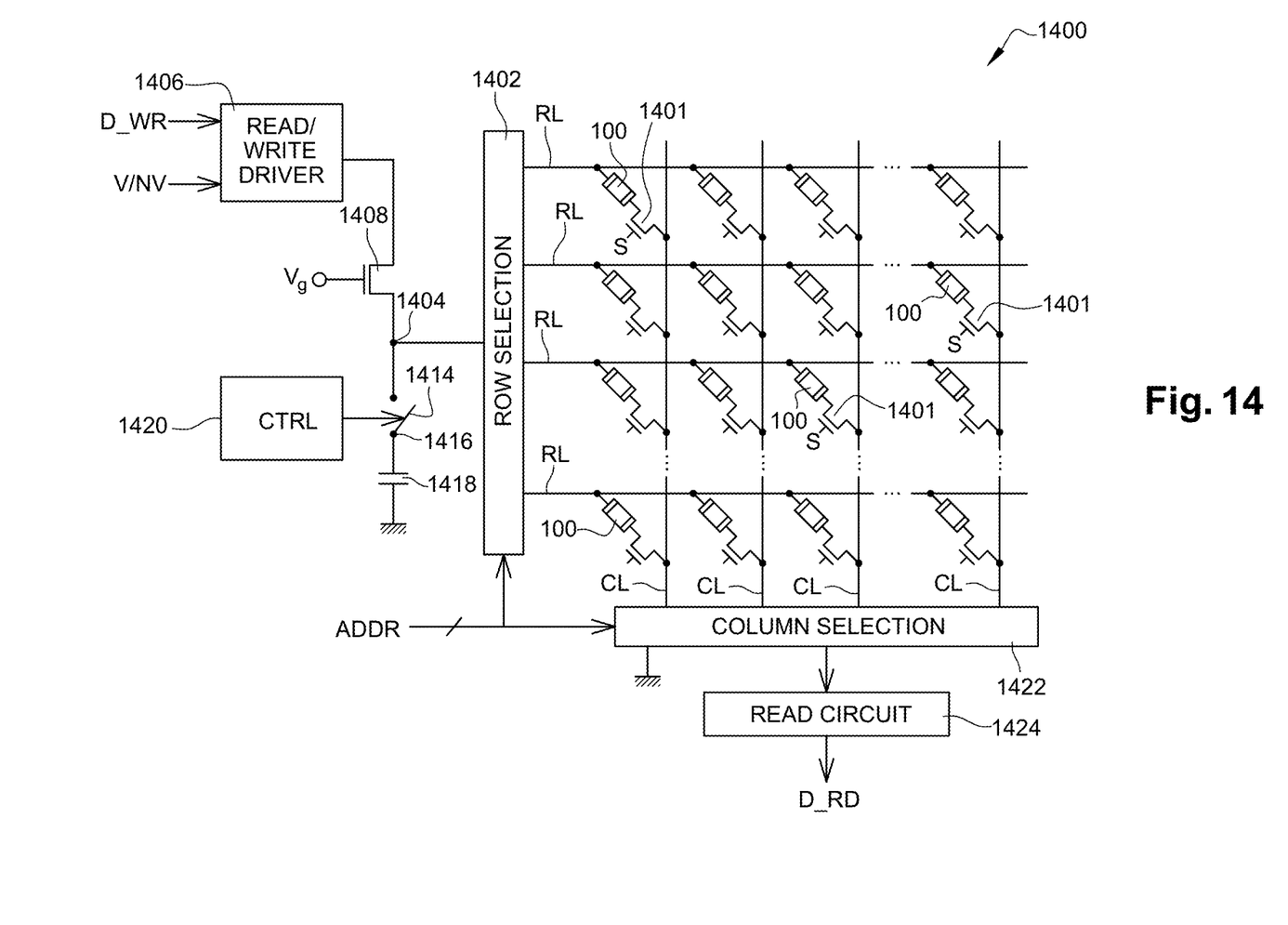
FIG. 14 schematically illustrates a memory array of resistive-switching elements according to an example embodiment of the present disclosure.

FIG. 14 schematically illustrates a memory array 1400 of resistive-switching elements 100 according to an example embodiment of the present disclosure.

In the example of FIG. 14, the array is a cross-point array, the elements 100 being arranged in rows and columns, and each element 100 being connected between a row line RL of its row, and a column line CL of its column. Each element 100 is for example coupled in series with a selector between the row and column lines RL, CL. In the example of FIG. 14, the selector is a transistor 1401 coupled in series with the element 100 via its main current-conducting nodes, and having its gate receiving a selection signal S. In alternative embodiments, the selector could be implemented by a diode.

A row selection circuit (ROW SELECTION) 1402 for example couples a selected row of the array to an input/output node 1404. The row selection circuit 1402 also for example generates the selection signal S. For example, all of the elements of each row receive a same signal S, and the rows are controlled independently such that one row of elements 100 can be selected at a time.

The input/output node 1404 is for example coupled to a read/write driver (READ/WRITE DRIVER) 1406 via a transistor 1408. The read/write driver 1406 is for example configured to apply a biasing voltage to a selected element based on a data bit D_WR to be written to the element in a set or reset operation, and/or based on a signal V/NW indicating whether the data bit is to be written in a volatile or non-volatile fashion. The read/write driver 1406 is also for example configured to apply a biasing voltage to a selected element during a read operation.

In some embodiments, the read/write driver 1406 is also configured to apply the deep reduction voltage(s) to a selected element via the node 1404.

The transistor 1408 is for example controlled by a gate voltage Vg, and acts as a current limiter that sets a compliance current during the set operation.

The input/output node 1404 is also coupled via a switch 1414 to an energy storage node 1416, which is in turn coupled to ground via a capacitor 1418. An energy recovery control circuit (CTRL) 1420 for example controls the switch 1414.

When energy is to be recovered from a selected element following the dissolution of its filament, the read/write driver 1406 for example applies a deep reduction voltage level to the element. The control circuit 1420 then for example activates the switch 1414 to couple the selected element to the energy storage node 1416 and thereby transfer charge to the capacitor 1418. While not illustrated in FIG. 14, the node 1416 is for example coupled to a load, for example via a switch, so that the energy stored to the capacitor 1418 can be extracted following each energy recovery operation.

A column selection circuit (COLUMN SELECTION) 1422 for example couples a selected element to the ground voltage rail during a write or energy recovery operation, and to a read circuit (READ CIRCUIT) 1424 during a read operation. For example, during a read operation, the read circuit 1424 detects a current passing through the selected element in order to read the programmed state of the selected element, and generate an output data bit D_RD.

The row and column selection circuits 1402, 1422 each for example receives all or part of an address signal ADDR indicating the resistive-switching element to be selected for a given operation.

While in the example of FIG. 14 a single control circuit 1420 is provided for the whole array 1400, in alternative embodiments a control circuit could be provided per resistive switching element 100.

An advantage of the embodiments described herein is that energy can be recovered following the dissolution of a filament of a resistive-switching element. In some embodiments, the filament is formed during a data programming cycle of the element to store a bit of data by programming the element to have the set state. In other words, energy is recovered that is a result of a programming operation and that would otherwise have been lost over time. This advantageously permits the energy consumption of the memory to be partially offset, and/or other circuits to be powered.

Various embodiments and variants have been described. Those skilled in the art will understand that certain features of these embodiments can be combined and other variants will readily occur to those skilled in the art. For example, while embodiments have been described in which each resistive-switching element is programmed to store a single bit by a set operation, the principles described herein could also be applied to recover energy following the dissolution of a filament storing a plurality of bits of data. For example, the element could be set at a selected one of two or more compliance currents, depending on the data bit to be stored, thereby causing different resistance ranges to be programmed.

The invention claimed is:

1. A memory comprising:
   a resistive-switching element having first and second electrodes separated by a layer of insulator;
   an energy storage component or load coupled to the resistive-switching element via a first switch; and
   a control circuit configured:
   to program the resistive-switching element to have a set state by activating a second switch while the first switch is deactivated, the second switch coupling the resistive-switching element to a biasing voltage of a first level, and having a first polarity, wherein, in the set state, a filament forms a conducting path between the first and second electrodes;
   following a dissolution of the filament causing the resistive-switching element to have a reset state, to place the resistive-switching element in open circuit by deactivating the second switch while the first switch is deactivated, and to recover electrical energy, generated by the dissolution of the filament, from one of the first and second electrodes by activating the first switch; and
   after recovering the electrical energy and prior to another programming operation of the resistive-switching element, to read the reset state of the resistive-switching element,
   wherein the control circuit is configured to apply a biasing voltage of a second level, and having a second polarity opposite to the first polarity, across the first and second electrodes in order to dissolve the filament,
   wherein the control circuit is configured to apply a biasing voltage of a third level, and having the second polarity, across the first and second electrodes prior to recovering the electrical energy, the third level having a greater absolute value than the second level, and
   wherein the control circuit is configured to apply a biasing voltage of a fifth level, and having the second polarity, across the first and second electrodes prior to recovering further energy, the fifth level having a greater absolute value than the third level.

2. The memory of claim 1, wherein the energy storage component or the load comprises:
   a capacitor; or
   an inductor; or
   a resistor; or
   any combination of two or three of the above.

3. The memory of claim 1, wherein the third level is in a range −0.5 to −5 V.

4. The memory of claim 1, wherein the third level has an absolute value that is equal to or greater than a fourth level at which a current conducted by the resistive-switching element falls to zero.

5. The memory of claim 1, further comprising a third switch coupling an energy storage node to the energy storage component or the load.

6. The memory of claim 1, further comprising an array comprised of the resistive-switching element and a plurality of further resistive-switching elements having first and second electrodes.

7. The memory of claim 6, wherein the control circuit is further configured to recover electrical energy from one of the first and second electrodes of each resistive switching element of the further resistive-switching elements following a dissolution of the filament of each resistive-switching element.

8. The memory of claim 6, further comprising a plurality of further control circuits for controlling the plurality of further resistive-switching elements.

9. The memory of claim 1, wherein the third level is in the range −1 to −3 V.

10. A method of programming a resistive-switching element having first and second electrodes, an energy storage component or load being coupled to the resistive-switching element via a first switch, the method comprising:
    programming, by a control circuit, the resistive-switching element to have a set state by activating a second switch while the first switch is deactivated, the second switch coupling the resistive-switching element to a biasing voltage of a first level, and having a first polarity, wherein, in the set state, a filament forms a conducting path between the first and second electrodes;

dissolving the filament by applying, by the control circuit, a biasing voltage of a second level, and having a second polarity opposite to the first polarity, across the first and second electrodes, following the dissolution of the filament causing the resistive-switching element to have a reset state, placing the resistive-switching element in open circuit by deactivating the second switch while the first switch is deactivated, and recovering, from one of the first and second electrodes, electrical energy generated by the dissolution of the filament by activating the first switch, the method further comprising, prior to recovering the electrical energy, applying, by the control circuit, a biasing voltage of a third level, and having the second polarity, across the first and second electrodes, the third level having a greater absolute value than the second level and prior to recovering further energy, applying a biasing voltage of a fifth level, and having the second polarity, across the first and second electrodes, the fifth level having a greater absolute value than the third level; and after recovering the electrical energy and prior to another programming operation of the resistive-switching element, reading the reset state of the resistive-switching element.

11. The method of claim 10, wherein the third level is in the range −0.5 to −5 V.

12. The method of claim 10, wherein the third level is in the range −1 to −3 V.

13. A memory comprising:
a resistive-switching element having first and second electrodes separated by a layer of insulator;
an energy storage component or load coupled to the resistive-switching element via a first switch; and
a control circuit configured:
to program the resistive-switching element to have a set state, wherein, in the set state, a filament forms a conducting path between the first and second electrodes, and,
following a dissolution of the filament, to recover electrical energy, generated by the dissolution of the filament, from one of the first and second electrodes by activating the first switch,
wherein the control circuit is configured to apply a biasing voltage of a first level, and having a first polarity, across the first and second electrodes in order to program the set state,
wherein the control circuit is configured to apply a biasing voltage of a second level, and having a second polarity opposite to the first polarity, across the first and second electrodes in order to dissolve the filament,
wherein the control circuit is configured to apply a biasing voltage of a third level, and having the second polarity, across the first and second electrodes prior to recovering the electrical energy, the third level having a greater absolute value than the second level, and
wherein the control circuit is configured to apply a biasing voltage of a further level, and having the second polarity, across the first and second electrodes prior to recovering further energy, the further level having a greater absolute value than the third level.

* * * * *